United States Patent [19]
Janssen et al.

[11] Patent Number: 5,365,534
[45] Date of Patent: Nov. 15, 1994

[54] INJECTION LASER AND PHOTOSENSOR ASSEMBLY

[75] Inventors: Adrian P. Janssen, Exwick; Martin P. Rees, Paignton, both of United Kingdom

[73] Assignee: Northern Telecom Limited, Montreal, Canada

[21] Appl. No.: 201,473

[22] Filed: Feb. 24, 1994

[30] Foreign Application Priority Data

Feb. 25, 1993 [GB] United Kingdom ............. 9303783

[51] Int. Cl.5 ........................................ H01S 3/02
[52] U.S. Cl. ................................ 372/36; 372/108; 372/109
[58] Field of Search ..................... 372/36, 108, 109

[56] References Cited

U.S. PATENT DOCUMENTS

| 4,360,275 | 11/1982 | Louderback | 356/446 |
| 4,366,492 | 12/1982 | Kitamura | 372/36 |
| 4,817,109 | 3/1989 | Miyauchi et al. | 372/92 |
| 4,954,853 | 9/1990 | Yoshida et al. | 372/36 |
| 5,052,005 | 9/1991 | Tanaka et al. | 322/36 |
| 5,226,052 | 7/1993 | Tanaka et al. | 372/36 |
| 5,233,580 | 8/1993 | Tanaka et al. | 372/36 |
| 5,245,620 | 9/1993 | Tanaka et al. | 372/36 |

FOREIGN PATENT DOCUMENTS 0210505 2/1987 European Pat. Off. .
2186112 8/1987 United Kingdom .

Primary Examiner—James W. Davie
Attorney, Agent, or Firm—Lee, Mann, Smith, McWilliams, Sweeney & Ohlson

[57] ABSTRACT

Light emitted from the rear facet of an injection laser diode chip is focused to a compact spot size at the photosensitive surface of a photodiode responsive to a laser bit rate of 2.5 Gbit/s by means of a substantially ellipsoidal reflector.

20 Claims, 3 Drawing Sheets

INJECTION LASER AND PHOTOSENSOR ASSEMBLY

BACKGROUND TO THE INVENTION

This invention relates to a type of injection laser and monitor photosensor assembly in which a reflector is employed to direct light emanating from a facet of the laser onto the photosensitive zone of the photosensor for monitoring the performance of the laser. It finds particular application in such types of assembly in which the laser is operated at high speed and the photosensor is required to respond to this modulation, which may for instance be at a frequency in excess of 2 GHz, typically in the region of 2.5 GHz. Typically a photosensor able to respond to such frequencies has a relatively small photosensitive surface, and so the practice, used for slow speed monitor photodiodes, of locating the photodiode at some distance behind the laser to intercept unguided light, is inappropriate for the high speed application because it would produce an inconveniently small photo current.

One solution to this problem would be to mount the high speed photosensor much closer to the laser facet, so that its photosensor surface intercepts much more of the divergent emission from the rear facet of the laser. A primary drawback of this approach is that close proximity is liable to introduce problems of excessive electrical cross-talk between the laser drive circuitry and the photosensor circuitry. An alternative solution is to keep the photosensor at some distance from the laser facet, and to introduce some form of focusing system between the two integers, for instance a lens or mirror. It is already known, for instance from GB-A-2 229 856, to use a microlens to couple light from an injection laser into the end of an optical fibre, and in principle the same sort of microlens arrangement can be used to couple light from the other end facet of the laser into a monitor photosensor. In practice however this optical coupling of the monitor photosensor to the laser is more difficult to implement. In the alignment of the fibre, the associated microlens can be secured in substantially the correct position, and then the fibre end can similarly be secured in the position providing substantial optimisation of the optical coupling, as determined by powering the laser and observing the amount of optical power to emerge from the far end of the store. Thereafter, fine adjustment of the positioning of the intervening microlens may be required to complete the optimisation. No particular difficulty is encountered in continuously observing the optical power output from the far end of the fibre all the time the position of its other end is being adjusted. On the other hand, to observe the output of the monitor photosensor, while its position is being adjusted, involves a requirement for electrical connection with that photosensor to be established before it has been fixed down in position, and therefore calls for the provision of flying leads or their equivalent.

SUMMARY OF THE INVENTION

Accordingly it is a general object of the present invention to avoid the disadvantages of the prior art.

According to the present invention there is provided an injection laser and photosensor assembly having a reflector providing optical coupling between an optical emission zone of the laser and a photosensitive surface of the photosensor, which reflector has its reflecting surface conforming substantially to a portion of an ellipsoid of revolution located with one focus substantially at said emission zone and the other focus substantially at said photosensitive surface.

The use of an ellipsoidal focusing reflector means that the excessive aberration problems associated with working with a conventional spherical focusing reflector in a region far removed from the paraxial condition are avoided. A particular advantage of this is that a reasonably good focus can be obtained even when the laser and photosensor are mounted with the laser emission zone and the photosensor photosensitive surface lying in substantially perpendicular planes—an arrangement that simplifies the making of electrical connection with these integers from a printed circuit board that is common to both integers.

The use of a prism to provide a planar reflecting surface for reflecting light emitted from the rear face of an injection laser downwardly on to the face of a photodetector is described in EP-A O 199 565. Similarly the use of a planar metallic reflector for this purpose is described in EP-A O 294 167, but in this instance the disclosure is in the context of the provision of a mirror whose orientation is to be adjusted by the bending of a member by which it is supported so as to adjust the amount of light falling on the photodetector in order to bring its photocurrent to a predetermined value for a given value of the light output of the laser. All the specific embodiments of EP-A O 294 187 employ planar reflectors, but the specification expressly contemplates using non-planar ones, explicitly 'focusing' or 'defocusing' reflectors. It is not, however, suggested in that specification that such a reflector would or could be used to form a sharply focused image of the emission zone of the laser at the photosensitive surface of small area photodetector. Indeed to attempt to do so would go against the whole tenor of that specification because this would provide a maximised value of the photocurrent for the given value of light output of the laser rather than the desired predetermined value. If the alignment of the reflector is then disturbed, it is apparent that, as the image moves away from registry with the photosensitive surface of the small area photodetector, the photocurrent falls away steeply, making the alignment that provides the desired predetermined photocurrent particularly critical, and therefore particularly susceptible to disturbance, for instance by the effects of temperature, stress relaxation or shock.

BRIEF DESCRIPTION OF THE DRAWINGS

There follows a description of the construction of a laser package incorporating a monitor photodiode, the package including an assembly embodying the invention in a preferred form. The description refers to the accompanying drawings in which.

DETAILED DESCRIPTION OF THE PREFERRED EMBODIMENT

Figure 1:
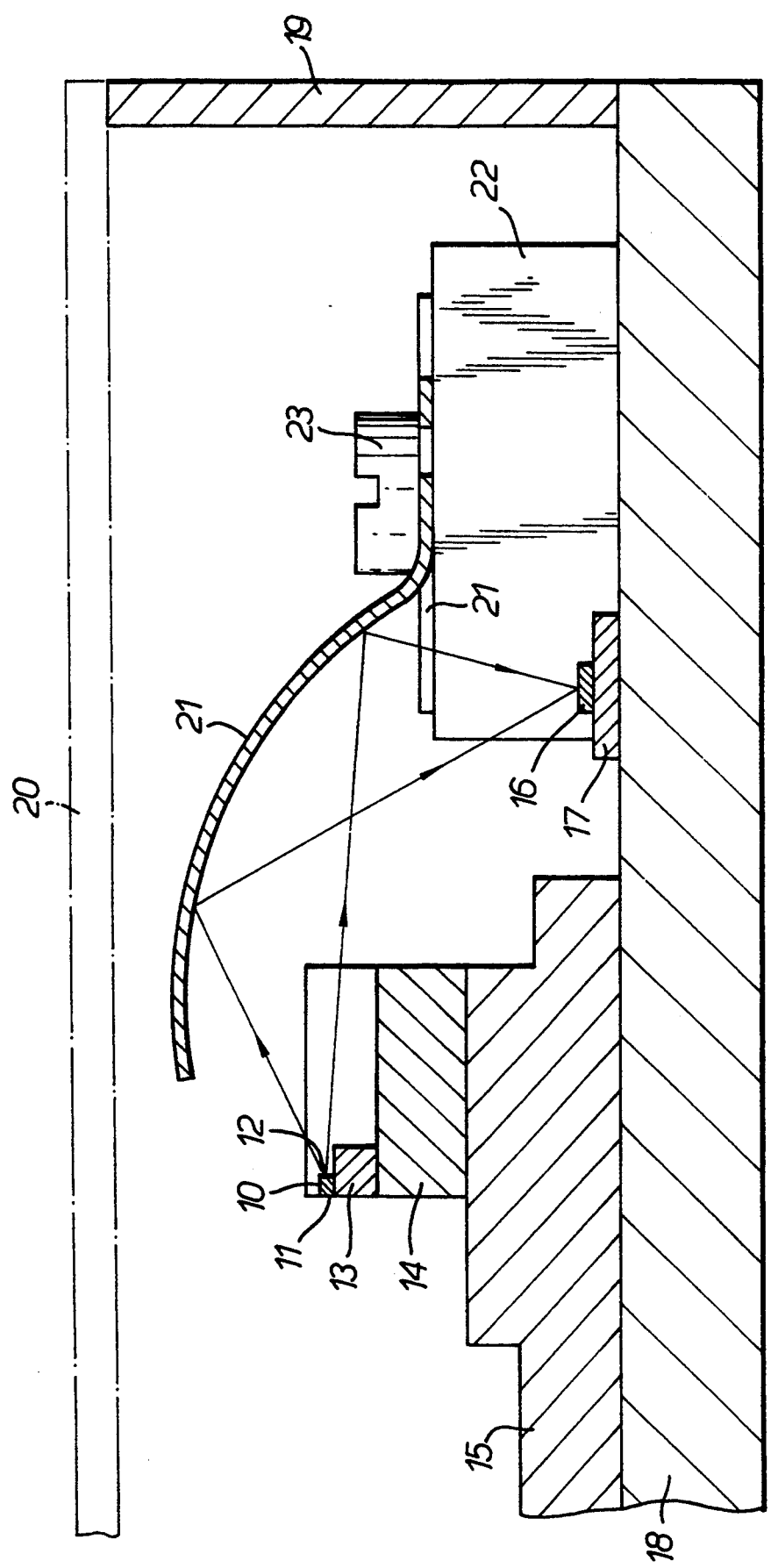
FIG. 1 depicts a longitudinal section of a portion of the package.

Referring to FIG. 1, an injection laser diode chip 10, with front emission facet 11 and rear emission facet 12, is mounted on a diamond heat sink 13 which is itself mounted on a metal submount 14 made of a low expansion coefficient nickel cobalt steel. One electrical connection with the laser diode chip is by way of the heat sink 13 and submount 14 to an electroded ceramic (not shown) secured to the submount to one side of the laser and its heat sink, while the other electrical connection is made direct to the electroded ceramic by way of a flying lead (not shown). This arrangement allows the mounted laser to be powered for testing purposes before the submount is mounted in position and secured to an optical bench 15. This bench, which is made of the same material as that of the submount, carries an optical system (not shown) for optically coupling the laser emission from the front emission facet 11 of the laser 10 with the end of an optical fibre (not shown). The optical fibre and the optical system that have been referred to in the preceding sentence have not been illustrated because the construction of neither one is germane to the present invention, which is concerned not with the use to which light emitted from the front facet is put, but instead is concerned with the use to which light emitted from the rear facet is put.

A high speed planar construction photodiode 16 capable of responding to a bit rate of 1.6 Gbit/s is mounted in position upon an electrical ceramic carrier 17 provided with conductor tracks (not shown) by means of which electrical connection with the diode 16 is made. This carrier 17, and the optical bench 15, are then mounted in predetermined positions in the bottom of a package comprising a multilayer ceramic circuit board base 18 with side walls 19 and a lid 20 that is fitted later. The photosensitive surface of the photodiode 16 lies in the surface opposite that which is bonded down on to the carrier 17, and hence this photosensitive surface and the rear emission facet 12 of the laser 10 are mounted within the package to lie in substantially perpendicular planes.

Figure 2:
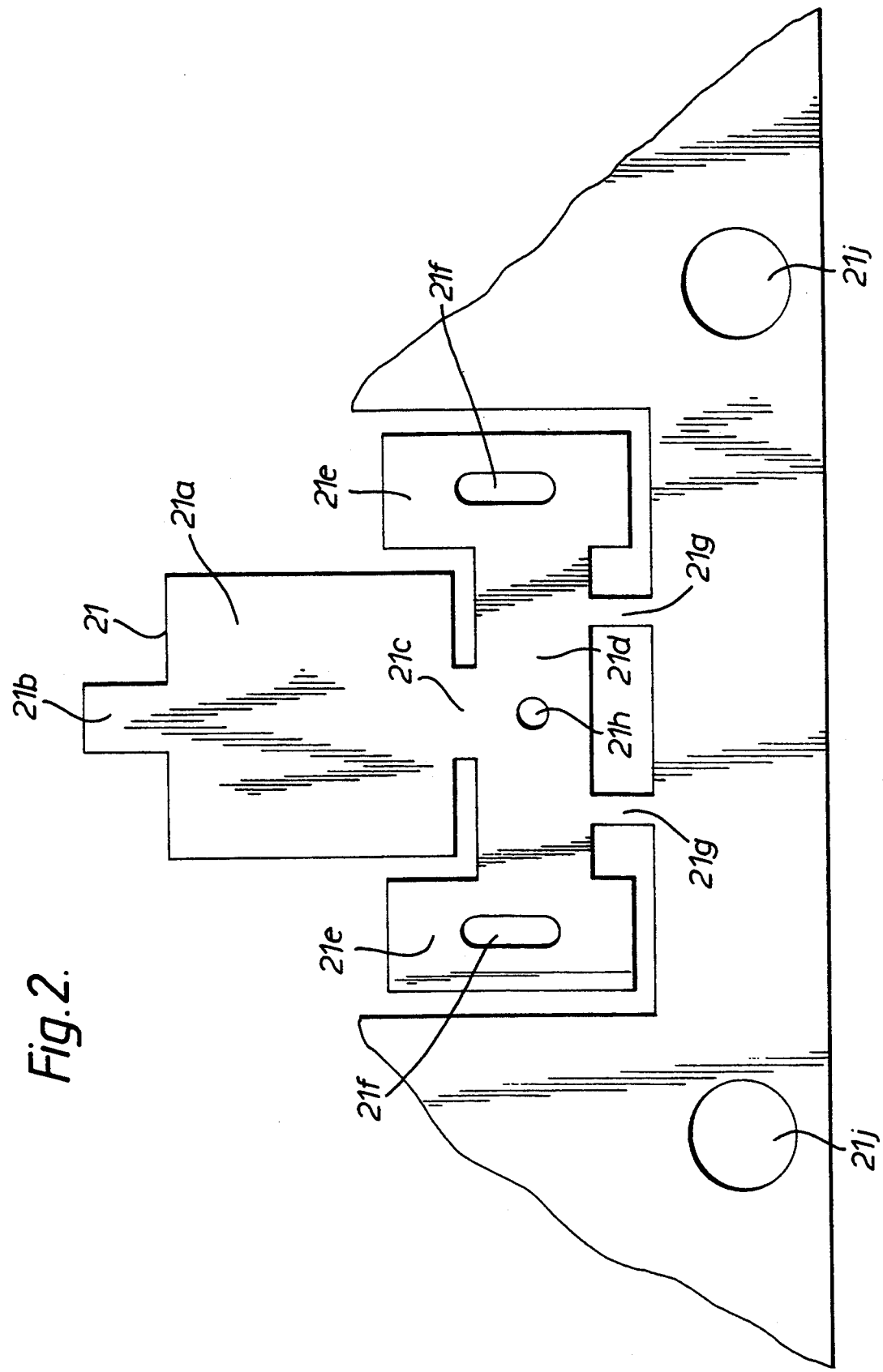
FIGS. 2 and 3 depict the reflector of the package respectively before and after it has been pressed into its final shape and detached from the sheet of metal from which it has been prepared.
Figure 3:
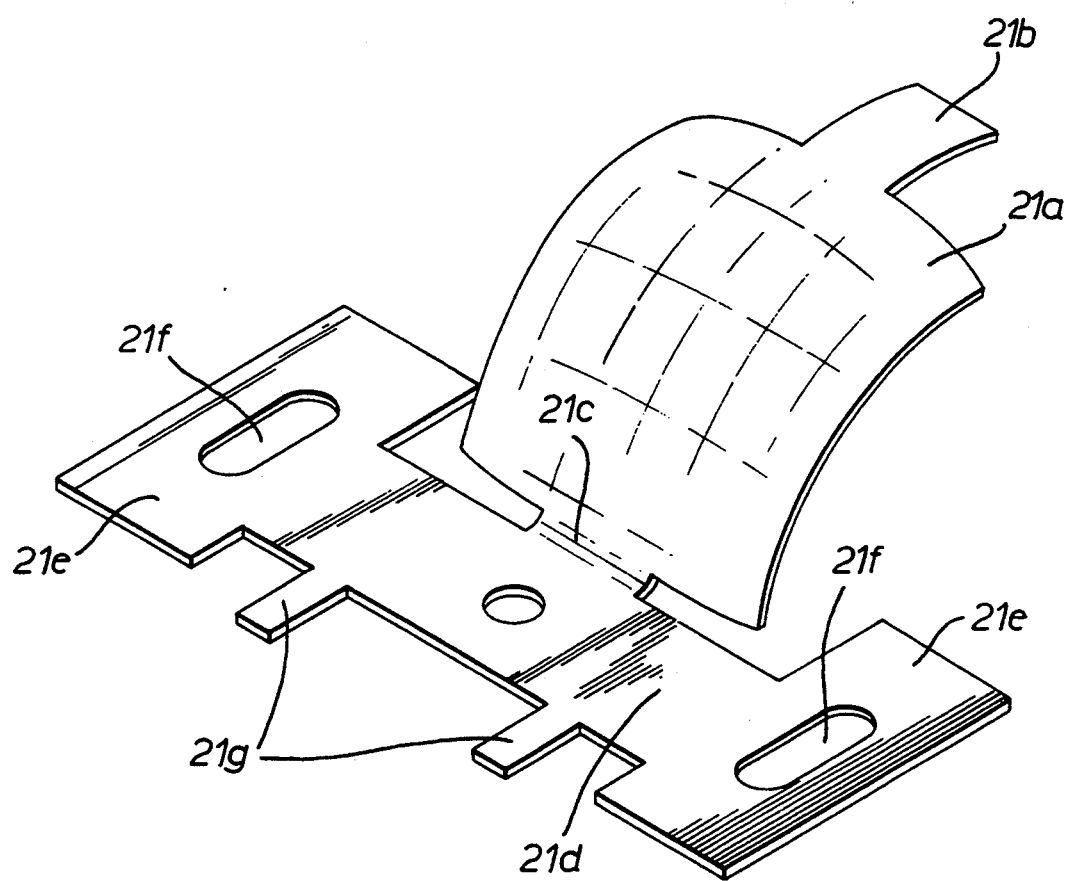

The emission from the rear facet 12 is focused on the photosensitive surface of the photodiode 16 by means of a focusing reflector 21. Though this reflector appears in FIG. 1, its shape is more readily ascertainable by reference to FIGS. 2 and 3 which respectively depict the reflector 21 before and after it has been pressed into its final shape and detached from the etched metal sheet from which it has been prepared. Before it has been pressed, while it is still in planar form, the reflector comprises a 5.0 mm square planar reflector portion 21a with a holding tab 21b projecting from the middle of the side opposite, and a root portion 21c by which the reflector portion 21a is connected with a crosspiece 21d that bridges between two feet 21e provided with screwhole slots 21f. This configuration is produced by photo-etching of the sheet, which is typically a 0.25 mm thick gold-plated polished sheet of low-expansion coefficient nickel cobalt steel. This photo-etching leaves the reflector still connected to the rest of the sheet by a pair of webs 20 g. While still in this attached condition, press tooling is employed simultaneously to dish the reflector portion 21a, converting it from planar to substantially ellipsoidal form, and to form the root portion 21c in such a manner that the reflector portion 21a is deflected out of the plane of the base portion that comprises the feet 21e and cross-piece 21d. The required amount of this deflection is fully predetermined having regard to the precise location of the laser 10 and the photodiode 16 with respect to the package base, to the precise shaping given to the reflector portion 21a, and to the fact that the feet 21e are mounted on pedestals 22 of precise height secured to the package base 18 either side of the photodiode ceramic carrier 17. The width of the root portion 21c is limited by the need to provide the requisite curvature in the reflector portion 21a. On the other hand a narrow width militates against the stiffness that is desirable to minimise susceptibility to shock-induced disturbance of the deflection. For this reason tooling, in the form of a hardened steel tool and co-operating die, is employed which stiffens the root portion 21c by forming it with curvature in two orthogonsl planes instead of curvature in only a single plane. The metal sheet is conveniently located for this pressing operation by means of indexing holes, such as holes 21h and 21j. It has been found that a sufficiently close approximation to the ideal ellipsoidal shape for the reflector portion 21a can be achieved using tooling machined to a toroidal shape—a shape which may be easier to generate than a truly ellipsoidal shape. The reflector 21 is held by its tab 21b while it is parted from the rest of the sheet by cropping its webs 21g and, while held in this way, is placed in the package with its two feet 21e atop the pair of pedestals 22 located on the package base 18 either side of the photodiode ceramic carrier 17. The reflector 21 is secured to these pedestals 22 by means of a pair of screws 23 engaged through the slots 21f. The two screws are slackened off sufficiently to allow the reflector feet some restricted freedom of movement across the top surface of the two pedestals. The laser is energised, and the reflector orientation adjusted for maximum output from the photodiode 16 before the screws are retightened. After final testing, the lid 20 is placed in position and secured.

In some instances it is undesirable for there to be any feedback of light into the laser that has been specularly reflected in the surface of the photodiode. This source of feedback can be avoided by arranging the configuration of the laser 10, diode 16 and reflector 21 so that the light that is specularly reflected in the surface of the diode is either reflected in directions that fail to be intercepted by the reflector, or is reflected in directions which are intercepted by the reflector but in directions that, after than reflection, cause the light to fail to reach the laser because it is intercepted by some other structure such as the heat sink 13 or submount 14.

We claim:

1. An injection laser and photosensor assembly having a reflector providing optical coupling between an optical emission zone of the laser and a photosensitive surface of the photosensor which reflector has its reflecting surface conforming substantially to a portion of an ellipsoid of revolution located with one focus substantially at said emission zone and the other focus substantially at said photosensitive surface.

2. An assembly as claimed in claim 1, wherein the reflector is made of sheet metal having a reflecting surface having a curvature which has been created by pressing.

3. An assembly as claimed in claim 2, wherein the curvature of the reflecting surface of the reflector has been created by pressing using a tooling of substantially toroidal profile.

4. An assembly as claimed in claim 1, wherein said emission zone and said photosensitive surface lie in substantially perpendicular planes.

5. An assembly as claimed in claim 4, wherein the reflector is made of sheet metal having a reflecting surface having a curvature which has been created by pressing.

6. An assembly as claimed in claim 1, wherein the arrangement of the laser, photosensor, reflector, and their mountings, is such that light from the emission zone of the laser that is focused by the reflector onto the photosensitive surface of the photosensor, and is specularly reflected at said surface, is prevented from being focused by the reflector back at the emission zone of the laser.

7. An assembly as claimed in claim 6, wherein the reflector is made of sheet metal having a reflecting surface having a curvature which has been created by pressing.

8. An assembly as claimed in claim 7, wherein the reflector is made of sheet metal, and the curvature of the reflecting surface of the reflector has been created by pressing using a tooling of substantially toroidal profile.

9. An assembly as claimed in claim 6, wherein said emission zone and said photosensitive surface lie in substantially perpendicular planes.

10. An assembly as claimed in claim 9, wherein the reflector is made of sheet metal having a reflecting surface having a curvature which has been created by pressing.

11. An assembly as claimed in claim 1, wherein the photosensor is a photodiode responsive to frequencies in excess of 2 G Hz.

12. An assembly as claimed in claim 11, wherein the reflector is made of sheet metal having a reflecting surface having a curvature which has been created by pressing.

13. An assembly as claimed in claim 11, wherein said emission zone and said photosensitive surface lie in substantially perpendicular planes.

14. An assembly as claimed in claim 13, wherein the reflector is made of sheet metal having a reflecting surface having a curvature which has been created by pressing.

15. An assembly as claimed in claim 11, wherein the arrangement of the laser, photosensor, reflector, and their mountings, is such that light from the emission zone of the laser that is focused by the reflector onto the photosensitive surface of the photosensor, and is specularly reflected at said surface, is prevented from being focused by the reflector back at the emission zone of the laser.

16. An assembly as claimed in claim 15, wherein the reflector is made of sheet metal having a reflecting surface having a curvature which has been created by pressing.

17. An assembly as claimed in claim 11, wherein said emission zone and said photosensitive surface lie in substantially perpendicular planes.

18. An assembly as claimed in claim 17, wherein the reflector is made of sheet metal having a reflecting surface having a curvature which has been created by pressing.

19. An assembly as claimed in claim 17, wherein the arrangement of the laser, photosensor, reflector, and their mountings, is such that light from the emission zone of the laser that is focused by the reflector onto the photosensitive surface of the photosensor, and is specularly reflected at said surface, is prevented from being focused by the reflector back at the emission zone of the laser.

20. An assembly as claimed in claim 19, wherein the reflector is made of sheet metal having a reflecting surface having a curvature which has been created by pressing.

* * * * *